(12) United States Patent
Malone et al.

(10) Patent No.: US 8,430,156 B2
(45) Date of Patent: Apr. 30, 2013

(54) LIQUID LOOP WITH MULTIPLE PUMP ASSEMBLY

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1736 days.

(21) Appl. No.: 10/835,956

(22) Filed: Apr. 29, 2004

(65) Prior Publication Data

US 2005/0244280 A1 Nov. 3, 2005

(51) Int. Cl.
*F24F 11/06* (2006.01)

(52) U.S. Cl.
USPC .............. 165/244; 165/80.5; 165/104.33; 165/299; 165/300; 361/699; 361/700; 361/701

(58) Field of Classification Search .............. 165/80.4, 165/80.5, 104.33, 244, 299, 300; 361/699, 361/700, 701
See application file for complete search history.

(56) References Cited

U.S. PATENT DOCUMENTS

| | | | |
|---|---|---|---|
| 2,600,039 A | 6/1952 | Whaley, Jr. | |
| 3,410,102 A | 11/1968 | Karsten | |
| 3,415,070 A | 12/1968 | Weum | |
| 3,491,544 A | 1/1970 | Webber | |
| 3,992,894 A | 11/1976 | Antonetti et al. | |
| 4,211,519 A * | 7/1980 | Hogan | 417/360 |
| 4,729,424 A | 3/1988 | Mizuno et al. | |
| 4,865,123 A * | 9/1989 | Kawashima et al. | 165/104.33 |
| 5,005,410 A * | 4/1991 | Webster et al. | 73/335.02 |
| 5,474,120 A * | 12/1995 | Severson et al. | 165/299 |
| 5,907,473 A | 5/1999 | Przilas et al. | |
| 6,141,986 A | 11/2000 | Koplin | |
| 6,182,742 B1 * | 2/2001 | Takahashi et al. | 165/80.4 |
| 6,639,797 B2 | 10/2003 | Saeki et al. | |
| 7,088,585 B2 * | 8/2006 | Chu et al. | 361/701 |
| 7,149,084 B2 * | 12/2006 | Matsushima et al. | 361/699 |
| 2003/0062149 A1 | 4/2003 | Goodson et al. | |
| 2003/0147214 A1 | 8/2003 | Patel et al. | |

FOREIGN PATENT DOCUMENTS

| | | |
|---|---|---|
| EP | 1571532 A2 | 9/2005 |
| EP | 1571532 A3 | 10/2006 |
| JP | 62-029774 | 2/1987 |
| JP | H3-99179 | 4/1991 |
| JP | H3-107589 | 5/1991 |
| JP | H5-231373 | 9/1993 |
| JP | 10-176692 | 6/1998 |
| JP | 2003-029879 | 1/2003 |
| JP | 2003-243869 | 8/2003 |
| JP | 2003-279536 | 10/2003 |
| WO | WO 2004/051445 A1 | 6/2004 |

OTHER PUBLICATIONS

UK Intellectual Property Office Examination Report, (Apr. 26, 2007), 1 pg.
Japan Patent Office, First Office Action, (Aug. 7, 2007), 3 pgs.
Japan Patent Office, Second Office Action, (Oct. 14, 2008), 6 pgs.
Japan Patent Office, Final Office Action, (May 27, 2008), 6 pgs.

* cited by examiner

*Primary Examiner* — Ljiljana Ciric

(57) ABSTRACT

A pump assembly includes inlet and outlet interfaces capable of coupling to a liquid cooling loop tubing, a plurality of pump connectors coupled to the inlet and outlet interfaces enabling pluggable connection of a plurality of pumps to the inlet and outlet interfaces, and a controller. The controller is coupled to the plurality of pumps and controls power levels of the individual pumps, enabling control of fluid flow rate in the liquid cooling loop.

14 Claims, 7 Drawing Sheets

LIQUID LOOP WITH MULTIPLE PUMP ASSEMBLY

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

As electronic components and subsystems evolve to increasing capability, performance, and higher power, while reducing size and form factor, efficient and cost-effective removal of excess heat is desired. Among available thermal management solutions, liquid cooling via cold plate technology offers high capacity for heat rejection and movement of heat from internal sources to external ambient air. Liquid cooling loop systems typically cycle pumped coolants continuously, conveying excess heat from heat-generating devices. The heat is dispersed into ambient air using a heat exchanger or other device.

A liquid loop cooling system generally uses a pump to drive the cooling fluid through high pressure-drop channels of cold plates attached to processors and other high-power components, and along potentially long and narrow-diameter tubes forming the loop between cold plates, condenser, and pump.

Pumps have a finite lifetime of operation. The pump in a liquid cooling loop system introduces a single-point of failure, a substantial weakness in system reliability. A common liquid cooling loop implementation uses a single loop to cool all processors in a system. The single point-of-failure presented by the pump increases system susceptibility to catastrophic failure in the event of pump failure that causes some or all processors to overheat.

SUMMARY

In accordance with an embodiment of an electronic liquid cooling system, a pump assembly includes inlet and outlet interfaces capable of coupling to a liquid cooling loop tubing, a plurality of pump connectors coupled to the inlet and outlet interfaces enabling pluggable connection of a plurality of pumps to the inlet and outlet interfaces, and a controller. The controller is coupled to the plurality of pumps and controls power levels of the individual pumps, enabling control of fluid flow rate in the liquid cooling loop.

BRIEF DESCRIPTION OF THE DRAWINGS

Embodiments of the invention relating to both structure and method of operation, may best be understood by referring to the following description and accompanying drawings.

DETAILED DESCRIPTION

A disclosed electronic liquid cooling system includes a redundant pump configuration to increase reliability, thereby eliminating the weakness of a single point-of-failure implementation. Multiple or redundant pumps ensure maintenance of acceptable cooling performance. Addition of pumps beyond the minimum enables what is termed "N+1 pump operation" in which N is the minimum number of pumps that attains acceptable cooling levels. Redundant pumps may be arranged in a parallel or series, depending on characteristics of the underlying pump technology.

Figure 1:
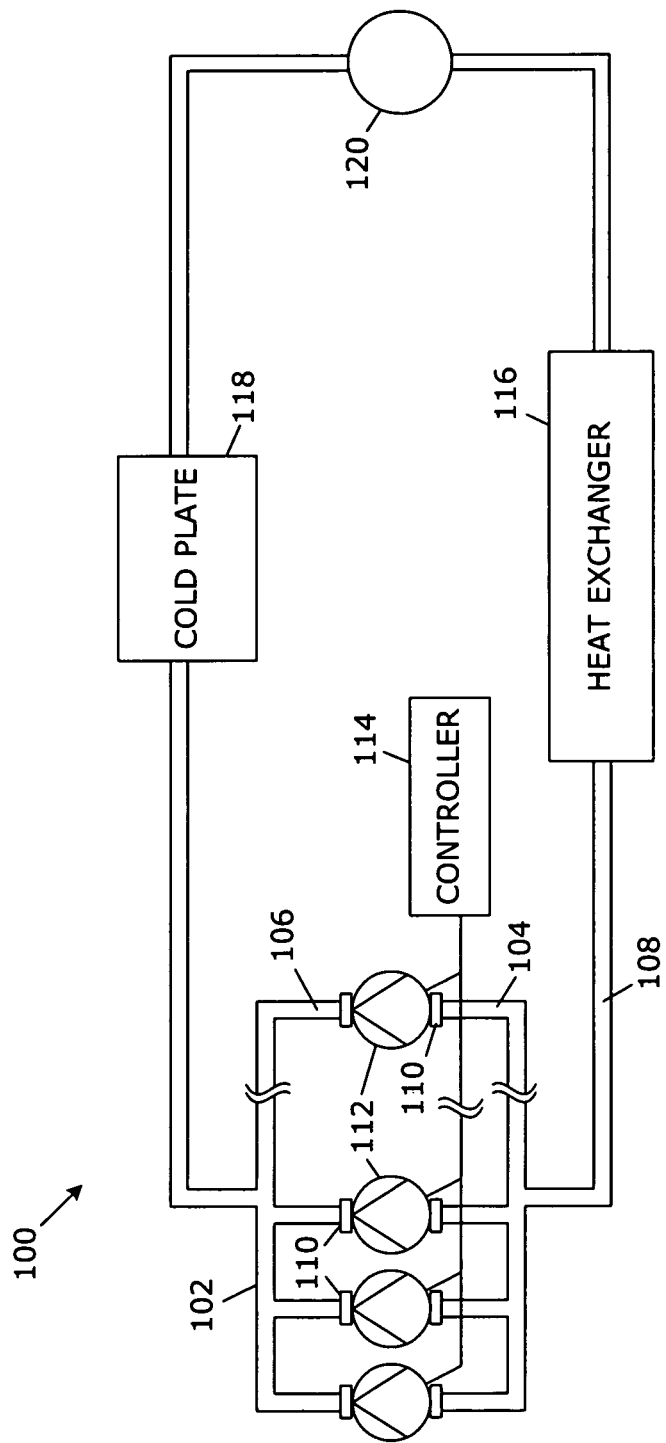
FIG. 1 is a perspective pictorial diagram showing an embodiment of an electronic liquid cooling system that includes a multiple pump assembly.

Referring to FIG. 1, a schematic block diagram illustrates an embodiment of an electronic liquid cooling system 100 that includes a multiple pump assembly 102. The multiple pump assembly 102 includes inlet 104 and outlet 106 interfaces capable of coupling to a liquid cooling loop tubing 108. A plurality of pump connectors 110 are coupled to the inlet 104 and outlet 106 interfaces to enable pluggable connection of a plurality of pumps 112 to the inlet 104 and outlet 106 interfaces. The pump assembly 102 also includes a controller 114 that is coupled to the plurality of pumps 112 and controls power levels of the individual pumps, enabling control of fluid flow rate in the liquid cooling loop.

The plurality of pumps 112 can be added to the multiple pump assembly 102 by coupling to the plurality of pump connectors 110. The number of pumps 112 can be selected to be at least one higher than a minimum to meet system cooling specifications. Some pump assembly embodiments may support even higher redundancy. For example, the number of pump connectors 110 may be selected to accommodate a sufficient number of redundant pumps 112 more than a minimum to meet system cooling specifications so that less expensive and less reliable pumps may be used while assuring higher reliability.

The controller 114 is connected to the pumps 112 to supply pump signals controlling flow rates of the individual pumps. The controller 114 can selectively drive flow through particular pumps while discontinuing flow through one or more other pumps. For example, the controller 114 can operate in a mode in which a redundant pump of the plurality of pumps 112 can be held non-operational until the controller 114 predicts or detects a failure condition, thereby maintaining the redundant pump in reserve. In response to selected conditions, the controller 114 can activate a redundant, deactivated pump to meet instantaneous cooling demand, enhancing reliability by avoiding or eliminating usage of the redundant pump until warranted by conditions.

During an "N+1 pump" operation, the controller 114 can operate the electronic liquid cooling system 100 to support a maximum heat load and, when the load is lower, scale back the pump performance to match the load. Alternatively, the load can be controlled by processor throttling techniques. Accordingly, the controller 114 continues to operate the electronic liquid cooling system 100 in N pump mode operation, although at a reduced performance.

Also during the N+1 pump mode operation, the controller 114 can save energy by operating all pumps at a reduced level. When operation is changed to N pump mode, the functioning pumps may be operated at full capacity.

The illustrative electronic liquid cooling system 100 further includes at least one heat exchanger 116, at least one cold plate 118, and at least one expansion valve 120 to manage dual-phase flow. The cold plate 118 transfers heat from electronic devices and components to cooling fluid in the tubing 108. The heat exchanger 116 transfers heat from cooling fluid in the tubing 108 to the air for removal.

The connectors 110 can be quick-disconnect connectors that enable hot-pluggable functionality. The pumps 112 can be hot-pluggable to enable safe removal and insertion without interrupting system operation. Quick disconnect connectors 110 enable engagement and disengagement from the electronic liquid cooling loop without loss of liquid.

In a particular embodiment, quick-disconnect connectors can be used for pumps connected in series to enable field replacement of non-functional units.

Figure 2C:
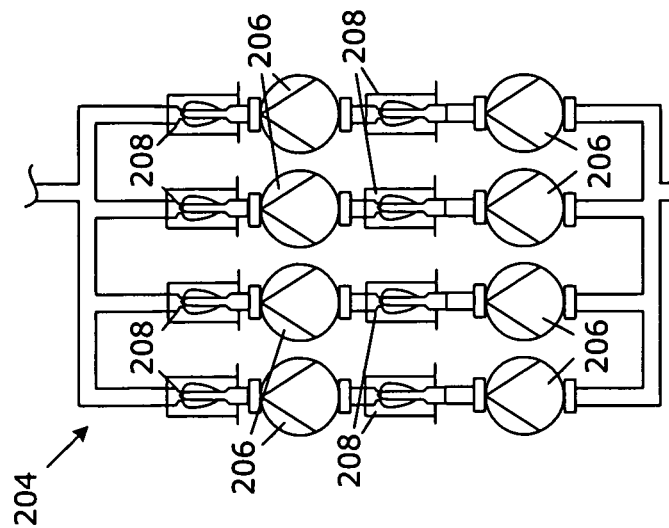
FIGS. 2A, 2B, and 2C are schematic block diagrams illustrating various embodiments of multiple pump assemblies.
Figure 2B:
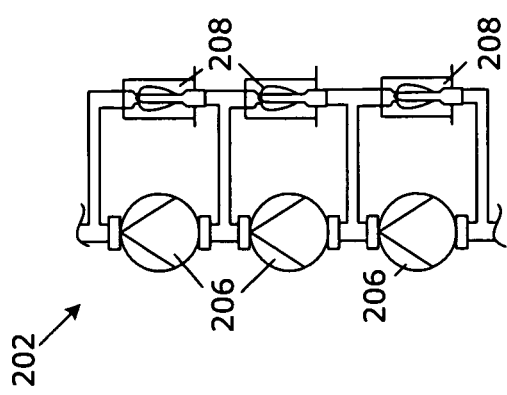
Figure 2A:
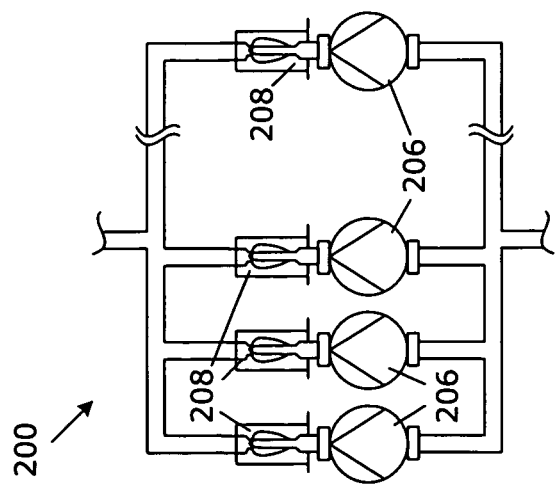

Referring to FIGS. 2A, 2B, and 2C, schematic block diagrams illustrate various embodiments of multiple pump assemblies 200, 202, and 204, respectively. The plurality of pump connectors can connect the plurality of pumps 206 in a configuration selected from among a group consisting of a serial connection 202, a parallel connection 200, and a combination serial and parallel connection 204. In some embodiments, a check valve 208 may be used to prevent back-flow through a non-operating pump.

Figure 3A:
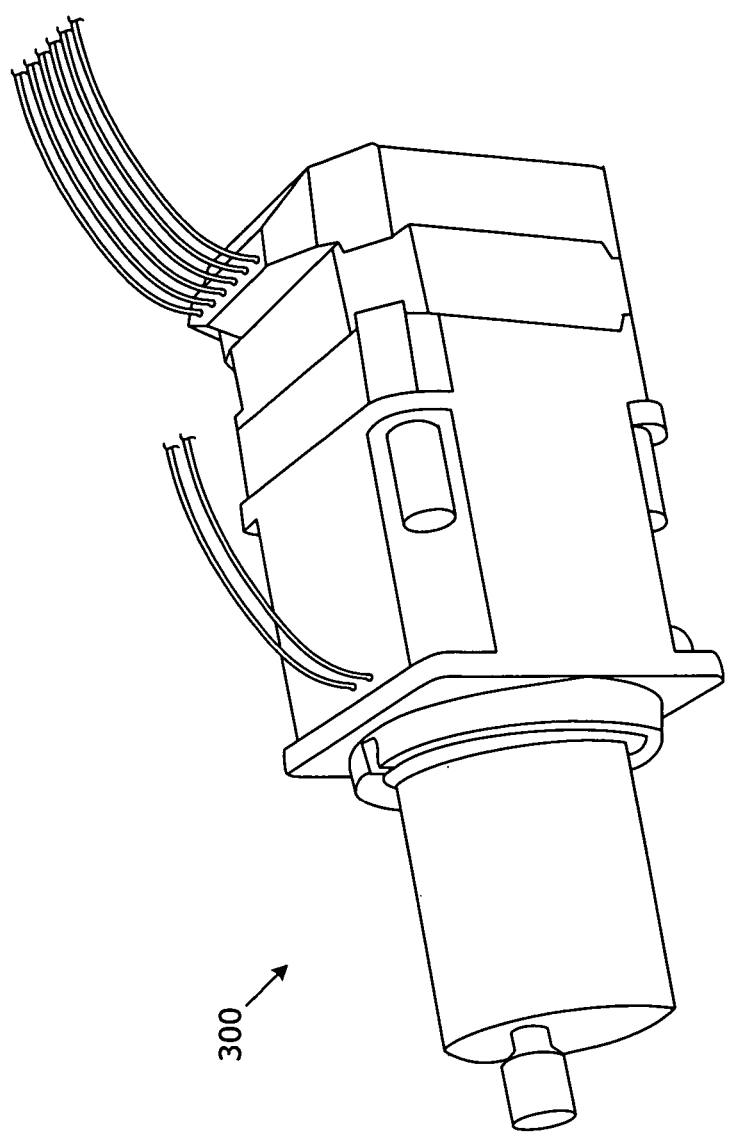
FIGS. 3A and 3B depict a perspective pictorial diagram and a schematic mixed pictorial and block diagram illustrating an embodiment of a suitable mechanical pump for usage in a multiple pump assembly.
Figure 3B:
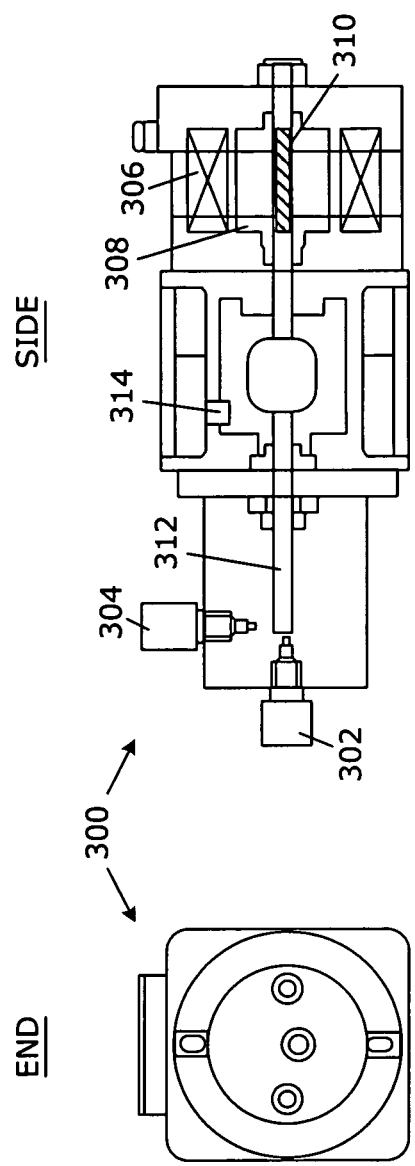

An electronic liquid cooling system typically uses kinetic or positive displacement mechanical pumps. Referring to FIGS. 3A and 3B, a perspective pictorial diagram and a schematic mixed pictorial and block diagram illustrate an embodiment of a suitable mechanical pump 300 for usage in a multiple pump assembly. The mixed pictorial and block diagram illustrated by FIG. 3B depicts end and side views of the pump 300. The mechanical pump 300 has an input port 302 and an output port 304 that connect to quick-release type connectors to enable hot-pluggable connection and removal of the pump 300. The pump 300 is driven by stepper motor coils 306 that rotate an internally-threaded rotor 308, moving a screw 310. A plunger 312 connected to the screw 310 discharges liquid inside the pump 300 through the output port 304. A sensor 314 inside the pump 300 detects motion of the plunger 312 and generates a pulse electrical signal that can be used for control and monitoring operations. Pump discharge and suction volumes can be controlled by monitoring pulse number and selectively driving the motor coils 306.

Figure 4:
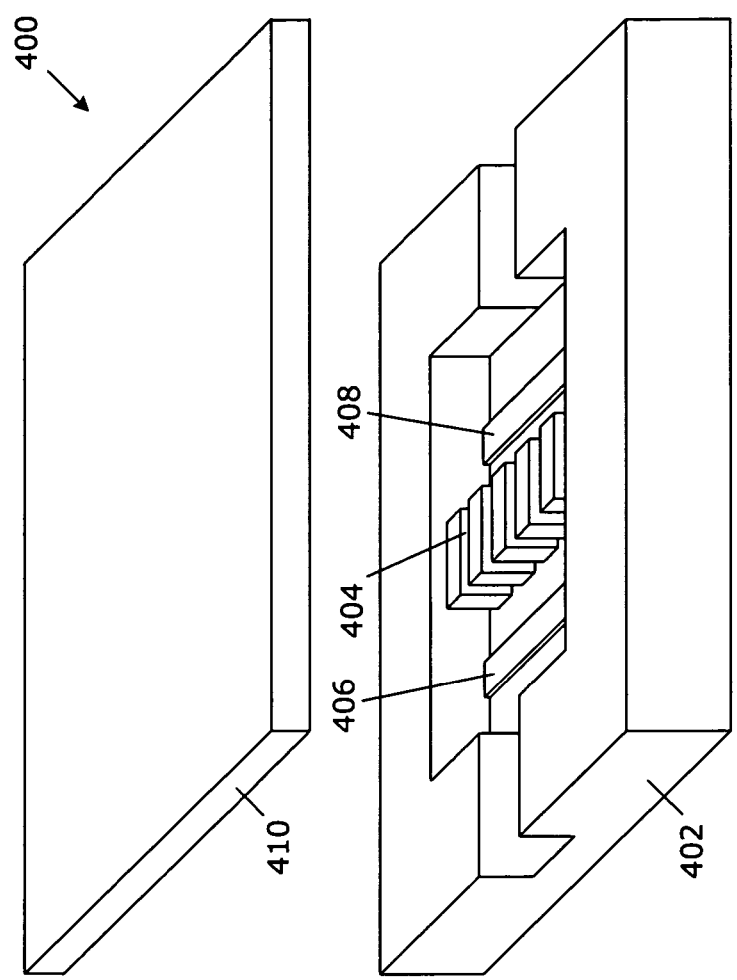
FIG. 4 is a perspective pictorial diagram illustrating an embodiment of an electro-osmotic pump that may be used in an electronic liquid cooling system.

Alternative pump technologies may otherwise be used for an electronic liquid cooling system, for example using piezoelectric crystals and/or electro-osmosis. Referring to FIG. 4, a perspective pictorial diagram illustrates an embodiment of an electro-osmotic pump that may be used in an electronic liquid cooling system. Electro-kinetic effects arising from electrochemical reactions at a liquid-solid phase interface can be used to generate pumping action in miniature systems. Electro-osmosis is an electro-kinetic effect that may be useful to pump liquids in microscale systems. An electro-osmosis pump may be constructed by various techniques, including micro-machining.

The illustrative example shows an electro-osmosis pump 400 including a micro-machined etched silicon substrate 402. Slots 404 with a large ratio of perimeter to cross-sectional area are deep-etched into the substrate 402. The cross-sectional area of pumping determines pumping flow rate is selected and implemented by varying the number of slots 404. The number of slots is proportional to flow rate. In some embodiments, the substrate 402 may be coated with a silicon nitride layer to passivate the silicon substrate and enable operation at relatively high voltage levels, for example in the range of hundreds of volts.

The pump 400 further includes an anode 406 and a cathode 408 embedded in the substrate 402 adjacent to the slots 404 upstream and downstream, respectively, to the slots 404. Electro-osmotic pumping is driven in the narrow, deep slots 404. A cover 410, for example constructed from glass, is bonded to the substrate 402. The cover 410 may be anodically-bonded to the substrate 402.

The anode 406 and cathode 408 apply an external electric field along the length of a capillary formed by the substrate 402 and cover 410 to generate electro-osmotic flow. The absence of moving parts may enable relatively reliable operation.

New pump technology, such as electro-osmotic pumps, may enable very compact form factors, thereby enabling many options for electronic system design. Drip-less connections and valves may be used to enable replacement of a defective pump while maintaining cooling operation. Extra pumps may be added to a cooling system to accommodate additional processors or higher power levels with new generations of processors via higher liquid loop flow rates. For example, a low-cost, single-processor liquid loop cooling solution can be developed with a minimum number of pumps. The cooling solution can accommodate higher heat loads or additional processors through the addition of extra pumps. The basis loop can be shared across multiple platforms with differing cooling requirements according to the number of processors, ambient conditions, and the like.

Figure 5:
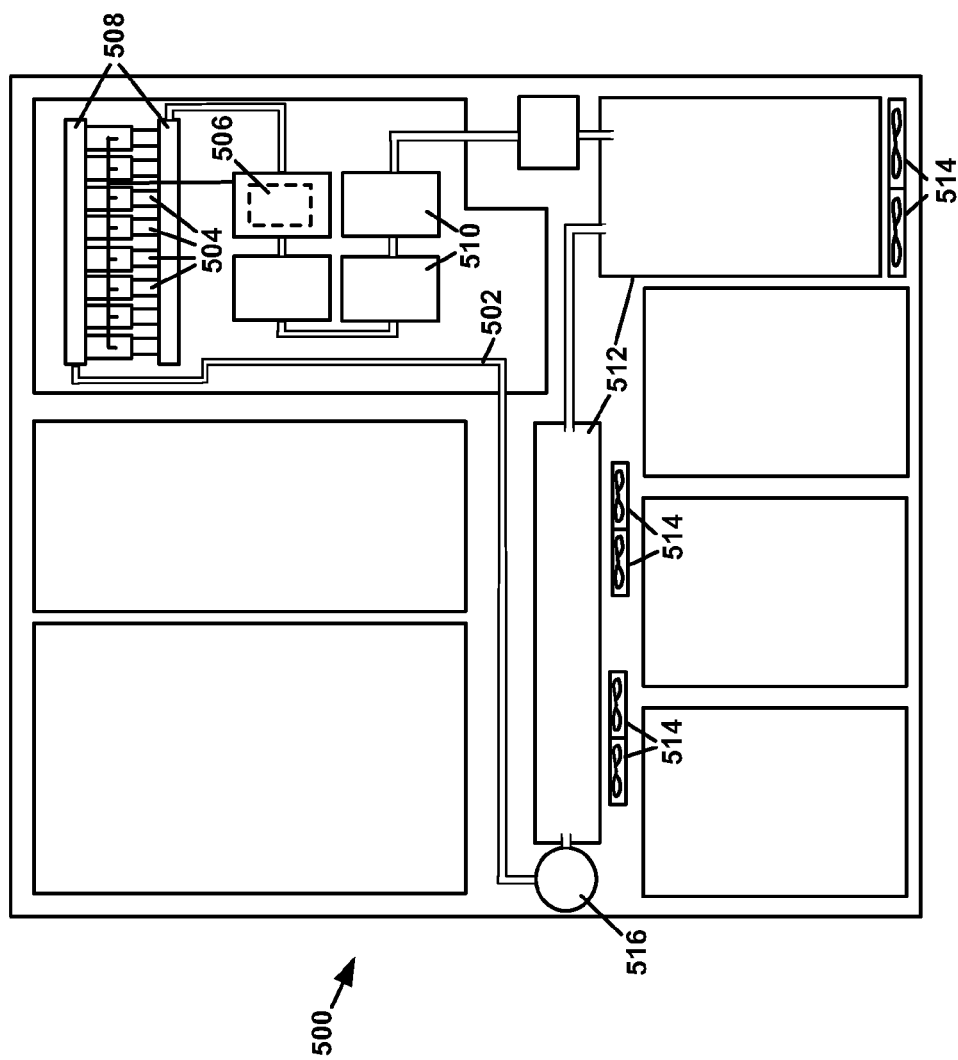
FIG. 5 is a schematic pictorial diagram showing an embodiment of an electronic liquid cooling system with redundant pumps and a controller capable of managing the pumps.

Referring to FIG. 5, a schematic pictorial diagram illustrates an embodiment of an electronic liquid cooling system 500 including a tubing 502 enclosing an interior bore or lumen within which a cooling fluid can circulate, and a plurality of pumps 504 having pluggable connections to the tubing 502 facilitating removal and addition of pumps 504 to the system 500. The number of pumps 502 is at least one higher than a minimum to meet system cooling specifications so that the pumps have a suitable level of redundancy to enable reliable performance. The electronic liquid cooling system 500 further includes a controller 506 capable of coupling to the plurality of pumps 504 and controlling power levels of the individual pumps, enabling control of fluid flow rate in the liquid cooling loop.

In some embodiments, the electronic liquid cooling system 500 can have paired connector banks 508 enabling replacement of the pumps, for example using hot-pluggable access. The connector banks 508 include interior tubing in a selected configuration that enables attached pumps 504 to be connected in various configurations including parallel, serial, or a combination of parallel and serial configurations.

In some systems 500, the number of pumps accommodated by the paired connector banks 508 is sufficiently more than a minimum to meet system cooling specifications so that less expensive and less reliable pumps may be used with higher reliability. For example, the amount of redundancy can be determined based on considerations of reliability and cost of the pumps. A balance can be sought between pump cost, mean time before failure in relation to cost, and probability of failure of multiple pumps.

The connector banks 508 may also include one or more check valves in selected locations, based on the particular pump configuration, to prevent back-flow through any non-operating pumps.

The controller 506 is capable of accessing information from sensors determining various conditions such as the temperature of electronics components cooled by the liquid loop, flow within the tubing 502 at one or more locations, and condition of individual pumps including pumping rate. The controller 506 can hold inactive one or more redundant pumps that are non-operational or non-active mode under normal conditions. The controller 506 can monitor conditions and either predict or detect a failure condition, and respond by activating the inactive redundant pump or pumps.

The controller 506 also operates to control pumping rate of the individual pumps based on monitored values. In a particular example, the controller 506 can detect the number of pumps 504 attached to the tubing 502 and the maximum heat load generated by electronic devices and components 510 that are cooled by the electronic liquid cooling system 500. The controller 506 uses the information to determine and control power levels of the pumps.

In various embodiments, the electronic liquid cooling system 500 may also include cooling devices such as heat exchangers 512 and associated fans 514. A system 500 may include a storage reservoir 516 that holds cooling fluid.

Figure 6:
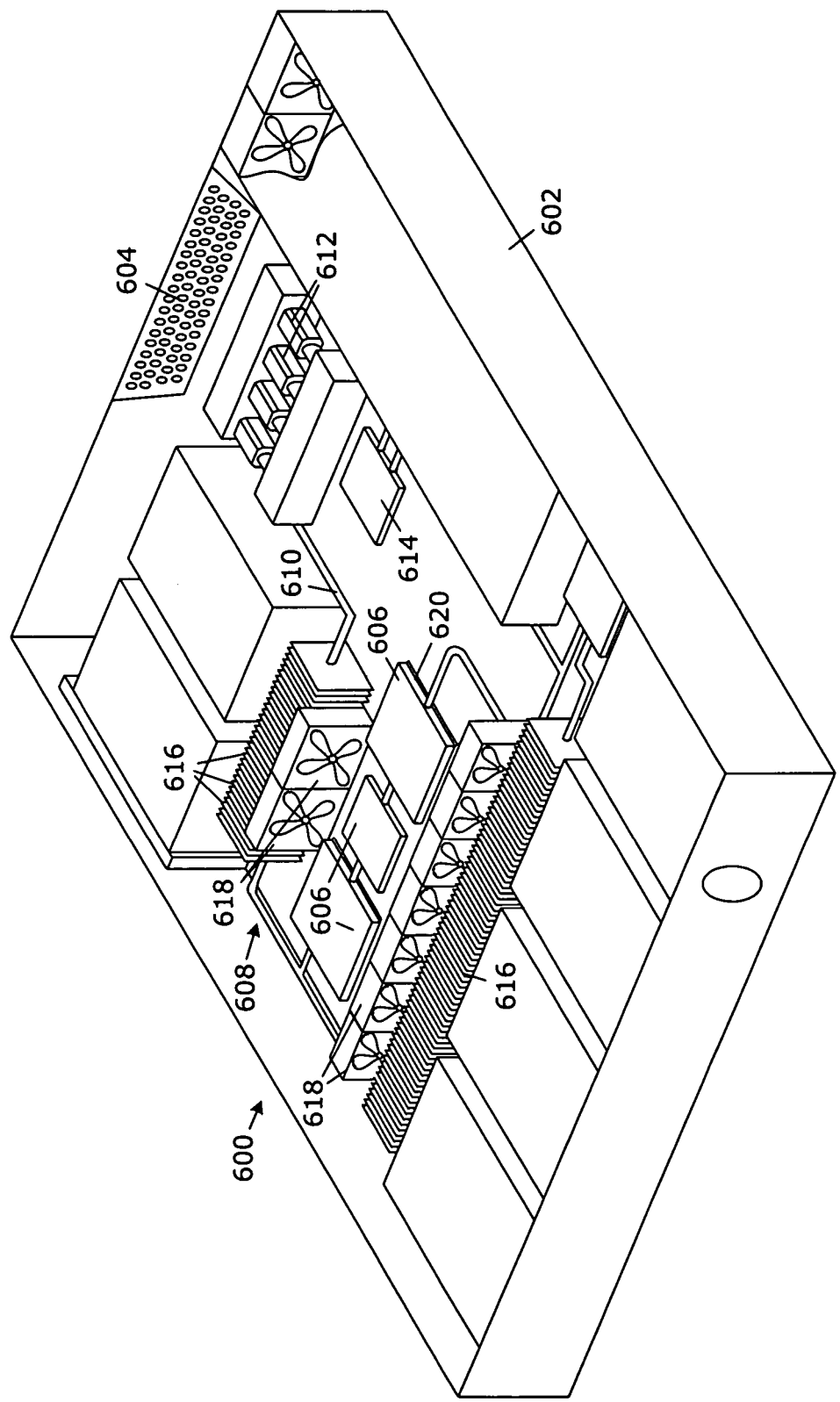
FIG. 6 is a perspective pictorial diagram that illustrates an embodiment of an electronic system, for example a computer server, including a multiple pump assembly and controller to manage pump redundancy.

Referring to FIG. 6, a perspective pictorial diagram illustrates an embodiment of an electronic system 600, for example a computer server, including a chassis 602 including airflow inlet and outlet vents 604, multiple components 606 including heat-generating components mounted within the chassis 602, and an electronic liquid cooling system 608. The electronic liquid cooling system 608 includes a tubing 610 enclosing an interior bore or lumen within which a cooling fluid can circulate. A plurality of pumps 612 has pluggable connections to the tubing 610. The number of pumps 612 is selected to be at least one higher than a minimum to meet cooling specifications based on conditions imposed by the heat-generating components 606. The electronic liquid cooling system 608 also includes a controller 614 that can be connected to the pumps 612. The controller 614 accesses various sensors to determine thermal conditions internal to the electronic system 600 and controls power levels of individual pumps 612 based on the thermal conditions to enable control of fluid flow rate in the liquid cooling loop.

Reliability of the electronic system 600 is improved by the addition of one or more redundant pumps 612. Additional pumps eliminate a single point of failure and reduce potential system reliability concerns. In an N+1 pump mode, pumps can operate at lower power levels, reducing stresses on the system and improving mean time to failure characteristics. Alternatively, in N pump mode, redundant pumps may be deactivated until warranted by conditions, for example a desire for additional pumping power. Accordingly, N+1 pump mode supports higher power levels. N pump mode supports lower power operation while improving reliability.

The electronic liquid cooling system 608 may also include one or more heat exchangers 616 coupled to the tubing 610. The individual heat exchangers 616 include a tube segment enclosing a segment interior lumen that passes the cooling fluid and extends from a first end to a second end, a plurality of fins coupled to the tube segment, and connectors coupled respectively to the first and second ends to connect the heat exchanger 616 to the tubing 610.

The pumps 612 are coupled to the tubing 610 and capable of pumping the cooling fluid through the tubing 610. The electronic liquid cooling system 608 also includes the cooling fluid, in some examples and ethylene glycol-based fluid although other suitable fluids may otherwise be used. The cooling fluid is contained within the tubing 610 and tube segments of the heat exchangers 616.

One or more fans 618 configured to drive air through the heat exchangers 616 can be included in the electronic liquid cooling system 608. In addition, one or more cold plates 620 may be coupled to the tubing 610. The cold plates 620 are generally attached to processors and other components 606, including heat-generating or high-power components, to enable cooling of localized heat sources.

The various heat exchangers 616 may have different shapes and/or sizes in an arrangement that improves or optimizes volume usage inside the chassis 602. Heat exchangers 616 may be added to the liquid loop to exploit otherwise unused volume within the electronics chassis 602, enabling usage of different sized fans 618 for heat exchangers 616 with different shapes.

Electronic system architectures such as server architectures with a compact form factor may include the electronic liquid cooling system 608 to accommodate increasing power and power density levels of components including microprocessors and associated electronics. The electronic liquid cooling system 608 uses the pumps 612 to drive the cooling fluid through high pressure-drop channels of the cold plates 620 attached to processors and other high-power components. The pumps 612 also drive the cooling fluid along a potentially long and narrow-diameter tube that completes the loop between the cold plates 620, the heat exchangers 616, and the pumps 612. Forced-air convection at the heat exchangers 616 removes heat from the loop.

In a compact electronic system 600, for example a compact server or computer system, cooling air is driven across the heat exchanger 616 using tube-axial or blower fans 618 in close proximity to the heat exchanger fins. Redundant fans 316 are typically used for electronic systems 600.

The illustrative structures can be used to perform a technique for cooling an electronic system 600 by configuring a liquid loop cooling system 608 using multiple pumps 612. The number of pumps 612 is selected to be at least one higher than a minimum to meet cooling specifications based on thermal conditions within the electronic system 600. The technique further includes determining thermal conditions within the electronic system 600 and controlling power levels of the individual pumps 612 based on the thermal conditions.

In a particular mode of operation, the technique involves maintaining one or more redundant pumps of the multiple pumps 612 as non-operational and predicting or detecting a failure condition. In response to the failure condition, a redundant pump may be placed into operation.

In other embodiments, the electronic liquid cooling system 608 can manage internal cooling by detecting the number of pumps connected to the liquid loop cooling system 608 and detecting a maximum heat load of the electronic system 600. Power levels of the multiple pumps 612 can be controlled according to the detected number of pumps and maximum heat load.

In particular embodiments, the electronic system 600 may be a low-profile system, for example having a form factor of 1 U or less. Low-profile computer system installations present significant thermal management difficulties. For example, Electronics Industry Association (EIA) standard racks are commonly used to house electronic equipment. In relatively large systems, for example 2 U or larger where "U" is the measuring unit for racks and rack-mountable components with 1 U=1.75" or 44.45 mm, most cooling air enters through the front of the enclosure and exits through the rear. For low-profile systems, the enclosure front is significantly blocked by hard drives and media devices. The rear is blocked by power supplies and input/output (I/O) connectors. To improve cooling efficiency, 1 U and 2 U servers may incorporate the illustrative electronic liquid cooling system 608 and incorporate the multiple pumps 612 to ensure reliable pumping operation.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular geometries and configurations of multiple pumps are shown, other arrangements are possible including additional groups of series and/or parallel pump connection circuits. Also, particular electronic system embodiments are illustrated, for example a computer server. In other embodiments, the redundant pump arrangements can be employed in other types of electronic systems such as communication systems, storage systems, entertainment systems, and the like.

What is claimed is:

1. A pump assembly for an electronic liquid cooling system comprising:
   inlet and outlet interfaces configured for coupling the pump assembly to a liquid cooling loop tubing;
   a plurality of pumps required for attaining acceptable cooling levels based on characteristics of an underlying pump technology for the pump assembly;
   a number of redundant pumps in addition to the plurality of pumps, wherein at least one of the number of redundant pumps is maintained as non-operational, and upon a prediction or detecting of a failure condition for the plurality of pumps, commences operation to meet an instantaneous cooling demand such that usage of the number of redundant pumps is eliminated unless warranted by conditions;
   a plurality of quick-disconnect pump connectors, accommodating the plurality of pumps and the number of redundant pumps, coupled to the inlet and outlet interfaces, the plurality of quick-disconnect pump connectors configured for being inserted into and removed from the inlet and outlet interfaces without loss of liquid during operation of the pump assembly; and
   a controller configured for coupling to the plurality of pumps and the number of redundant pumps, when installed, and controlling power levels of the individual pumps wherein fluid flow rate in the liquid cooling loop is controlled.

2. The pump assembly according to claim 1 further comprising:
   a plurality of pumps installed and coupled to the plurality of pump connectors.

3. The pump assembly according to claim 1 further comprising:
   a plurality of pumps installed and coupled to the plurality of pump connectors wherein the plurality of pump connectors connect the plurality of pumps in a configuration selected from among a group consisting of a serial connection, a parallel connection, and a combination serial and parallel connection.

4. The pump assembly according to claim 1 further comprising:
   a plurality of pumps installed and coupled to the plurality of pump connectors; and
   a check valve coupled to a pump of the plurality of pumps that prevents back-flow through a non-operating pump.

5. An electronic liquid cooling system comprising:
   a tubing enclosing an interior bore or lumen within which a cooling fluid can circulate;
   a plurality of pumps required for attaining acceptable cooling levels based on characteristics of an underlying pump technology for the pump assembly;
   a number of redundant pumps in addition to the plurality of pumps, wherein at least one of the number of redundant pumps is maintained as non-operational, and upon a prediction or detecting of a failure condition for the plurality of pumps, commences operation to meet an instantaneous cooling demand such that usage of the number of redundant pumps is eliminated unless warranted by conditions, wherein the plurality of pumps and the number of redundant pumps are coupled via pluggable connections to the tubing, wherein the pluggable connections are a plurality of quick-disconnect pump connectors configured for being inserted into and removed from the inlet and outlet interfaces without loss of liquid during operation of the electronic liquid cooling system; and
   a controller coupled to the plurality of pumps and the number of redundant pumps and controlling power levels of the individual pumps wherein fluid flow rate in the liquid cooling loop is controlled.

6. The system according to claim 5 further comprising:
   a check valve coupled to a pump of the plurality of pumps that prevents back-flow through a non-operating pump.

7. The system according to claim 5 wherein:
   the plurality of pumps coupled in a configuration selected from among a group consisting of a serial connection, a parallel connection, and a combination serial and parallel connection.

8. The system according to claim 5 wherein:
   the controller operates in a mode that detects the number of pumps connected to the tubing and a maximum heat load, and controls power levels of the plurality of pumps based on the number of connected pumps and the maximum heat load.

9. An electronic system comprising:
   a chassis including airflow inlet and outlet vents;
   a plurality of components including heat-generating components mounted within the chassis; and
   an electronic liquid cooling system comprising:
      a tubing enclosing an interior bore or lumen within which a cooling fluid can circulate;
      a plurality of pumps required for attaining acceptable cooling levels based on characteristics of an underlying pump technology for the pump assembly;
      a number of redundant pumps in addition to the plurality of pumps, wherein at least one of the number of redundant pumps is maintained as non-operational, and upon a prediction or detecting of a failure condition for the plurality of pumps, commences operation to meet an instantaneous cooling demand such that usage of the number of redundant pumps is eliminated unless warranted by conditions, wherein the plurality of pumps and the number of redundant pumps are coupled via pluggable connections to the tubing, wherein the pluggable connections are a plurality of quick-disconnect pump connectors configured for being inserted into and removed from the inlet and outlet interfaces without loss of liquid during operation of the electronic liquid cooling system; and a controller coupled to the plurality of pumps and the number of redundant pumps, that determines thermal conditions internal to the electronic system, and controls power levels of the individual pumps based on the thermal conditions wherein fluid flow rate in the liquid cooling loop is controlled.

10. The system according to claim 9 further comprising:
a check valve coupled to a pump of the plurality of pumps that prevents back-flow through a non-operating pump.

11. The system according to claim 9 further comprising:
the plurality of pumps coupled in a configuration selected from among a group consisting of a serial connection, a parallel connection, and a combination serial and parallel connection.

12. The system according to claim 9 wherein:
the controller operates in a mode that detects the number of pumps connected to the tubing and a maximum heat load, and controls power levels of the plurality of pumps based on the number of connected pumps and the maximum heat load.

13. A method of cooling an electronic system comprising:
configuring a liquid loop cooling system with a plurality of pumps coupled in combination;
determining thermal conditions within the electronic system;
maintaining a redundant pump of the plurality of pumps as non-operational;
predicting or detecting a failure condition;
in response to the failure condition, commencing operation of the redundant pump to meet an instantaneous cooling demand such that usage of the redundant pump is eliminated unless warranted by the failure condition; and
controlling power levels of the individual pumps based on the thermal conditions.

14. The method according to claim 13 further comprising:
detecting the number of pumps connected to the liquid loop cooling system;
detecting a maximum heat load of the electronic system; and
controlling power levels of the plurality of pumps according to the detected number of pumps and maximum heat load.

* * * * *